United States Patent [19]
Hshieh et al.

[11] Patent Number: 5,468,982
[45] Date of Patent: Nov. 21, 1995

[54] TRENCHED DMOS TRANSISTOR WITH CHANNEL BLOCK AT CELL TRENCH CORNERS

[75] Inventors: Fwu-Iuan Hshieh, Saratoga; Sze-Hon Kwan, Sunnyvale; Mike F. Chang, Cupertino; Yueh-Se Ho, Sunnyvale; Jan Van Der Linde, Saratoga; King Owyang, Atherton, all of Calif.

[73] Assignee: Siliconix incorporated, Santa Clara, Calif.

[21] Appl. No.: 253,527

[22] Filed: Jun. 3, 1994

[51] Int. Cl.[6] ............................ H01L 29/68; H01L 21/265
[52] U.S. Cl. ........................ 257/331; 257/332; 257/341; 257/401; 257/520; 257/622; 437/48; 437/66; 437/67; 437/78; 437/79; 437/225; 437/913
[58] Field of Search ........................................ 257/330, 331, 257/332, 341, 401, 520, 622; 437/48, 66, 67, 78, 79, 225, 913

[56] References Cited

U.S. PATENT DOCUMENTS 4,567,641  2/1986  Baliga et al. ........................ 257/331

Primary Examiner—Edward Wojciechowicz
Attorney, Agent, or Firm—Skjerven, Morrill, MacPherson, Franklin & Friel

[57] ABSTRACT

A trenched DMOS transistor has improved device performance and production yield. During fabrication the cell trench corners, i.e. the areas where two trenches intersect, are covered on the principal surface of the integrated circuit substrate with a blocking photoresist layer during the source region implant step in order to prevent (block) a channel from forming in these corner areas. Punch-through is thereby eliminated and reliability improved, while source/drain on-resistance is only slightly increased. The blocking of the trench corners creates a cutout structure at each trench corner, whereby the source region does not extend to the trench corner, but instead the underlying oppositely-doped body region extends to the trench corner.

21 Claims, 5 Drawing Sheets

TRENCHED DMOS TRANSISTOR WITH CHANNEL BLOCK AT CELL TRENCH CORNERS

CROSS REFERENCE TO RELATED APPLICATIONS

The assignee of the present application also owns copending and related patent applications, Ser. No. 08/290,323, entitled "Trenched DMOS Transistor Fabrication Using Seven Masks and Having Thick Termination Oxide", Ser. No. 07/918,996 entitled "High Voltage Transistor Having Edge Termination . . . ", and U.S. Pat. No. 5,404,040, entitled "Structure and Fabrication of Power MOSFETS, Including Termination Structure", and U.S. Pat. No. 5,304, 831, entitled "Low On-Resistance Power MOS Technology"; all incorporated by reference.

BACKGROUND OF THE INVENTION

1. Field of the Invention

This invention relates to trenched transistors (both FET and bipolar) and more specifically to a trenched DMOS transistor defined by intersecting trenches formed so as to have no channel in the transistor cell corner areas as defined by two intersecting trenches, so as to eliminate punch-through.

2. Description of the Prior Art

The well known DMOS transistors are a type of MOSFET using diffusions to form the active transistor regions. It is known to form such transistors having a trench in the substrate, the trench being lined with a thin oxide layer and filled with a conductive polysilicon to form the transistor gate structure. These transistors are typically used for power applications such as high current switching applications.

Prior art trenched DMOS transistors disadvantageously require a large number of masking steps to define the various transistor regions, including the tubs for the active transistor regions, the body region, the source region, and the body contact regions, each of which are separate diffusions. Additional masking steps define the oxide layers and polysilicon portions of the transistor. Each additional masking step requires mask alignment, resulting in the possibility of alignment error, undesirably reducing yield. Additionally, the many process steps (which include temperature cycles) result in diffusion of certain of the implanted ions, thus undesirably altering the lateral extent and/or depth of the diffused regions.

Such transistors are also deficient in that the prior art etching processes for the trench damage the trench sidewalls, affecting the sidewall oxide thickness and thus adversely affecting transistor performance.

In the prior art typical trenched transistor, another significant problem is punch-through. Punch-through is well known as an undesirable gate-controllable phenomena whereby a channel of the transistor is depleted. Punch-through typically occurs at the channel region of the transistor in the form of a non-destructive leakage current, prior to avalanche breakdown. Punch-through is especially a problem with trenched DMOS transistors which tend to break down electrically at the sharp corners where two trenches intersect, as is typically the case with closed cell transistors.

Punch-through tends to occur at corners because 1) at the corners, the two dimensional diffusion results in the presence of less source dopant; and 2) the electric field at the corners is stronger due to the corner curvature.

SUMMARY OF THE INVENTION

In accordance with the invention a trenched DMOS transistor is fabricated in a substrate so that at the principal surface of the substrate, at the cell corners where two trenches intersect, the source regions do not extend to the cell corners thereby preventing the channel from forming in the cell corners. Instead, the underlying body region extends to the principal surface at the cell corners. This has been found to eliminate the above-described punch-through problem and also to improve reliability, while only slightly increasing the undesirable on-resistance.

Therefore in accordance with the invention, production yield is increased by minimizing the drain-source punch-through leakage current. This invention is applicable to any multi-cell transistor using trenches, including insulated gate bipolar transistors. Typically the invention applies to closed cell transistors having hexagonal, square, or rectangular shaped cells, but also applies to the corners of open (linear) cells where two trenches meet at e.g. a right angle to define the end of a linear cell. It has been found in accordance with the invention that production yield is increased 20% to 30% over that of the prior art, while the performance in terms of the on-resistance decreases only a few percent (less than 5%) over prior art transistors. Thus the overall performance is better due to the reduced leakage current (i.e. less punch-through). The decrease in punch-through leakage current is by a factor of 1,000 to 10,000, over the prior art; in the prior art the punch-through leakage current is about 1 microamp, whereas in accordance with the invention it is about 1 nanoamp.

A process to achieve a transistor structure in accordance with the invention is mostly conventional, except that the topside (plan view) configuration of the source/drain regions is defined by an additional masking step to block the source dopant implant at the corner of each transistor cell, i.e., at the point where two intersecting trenches join.

BRIEF DESCRIPTION OF THE FIGURES

FIGS. 2 through 7a and 8 through 13 depict a sequence of steps to form a transistor (shown in cross section) in accordance with the invention.

FIG. 7b depicts a plan view of the processing step shown in FIG. 7a.

DETAILED DESCRIPTION OF THE INVENTION

Figure 1:
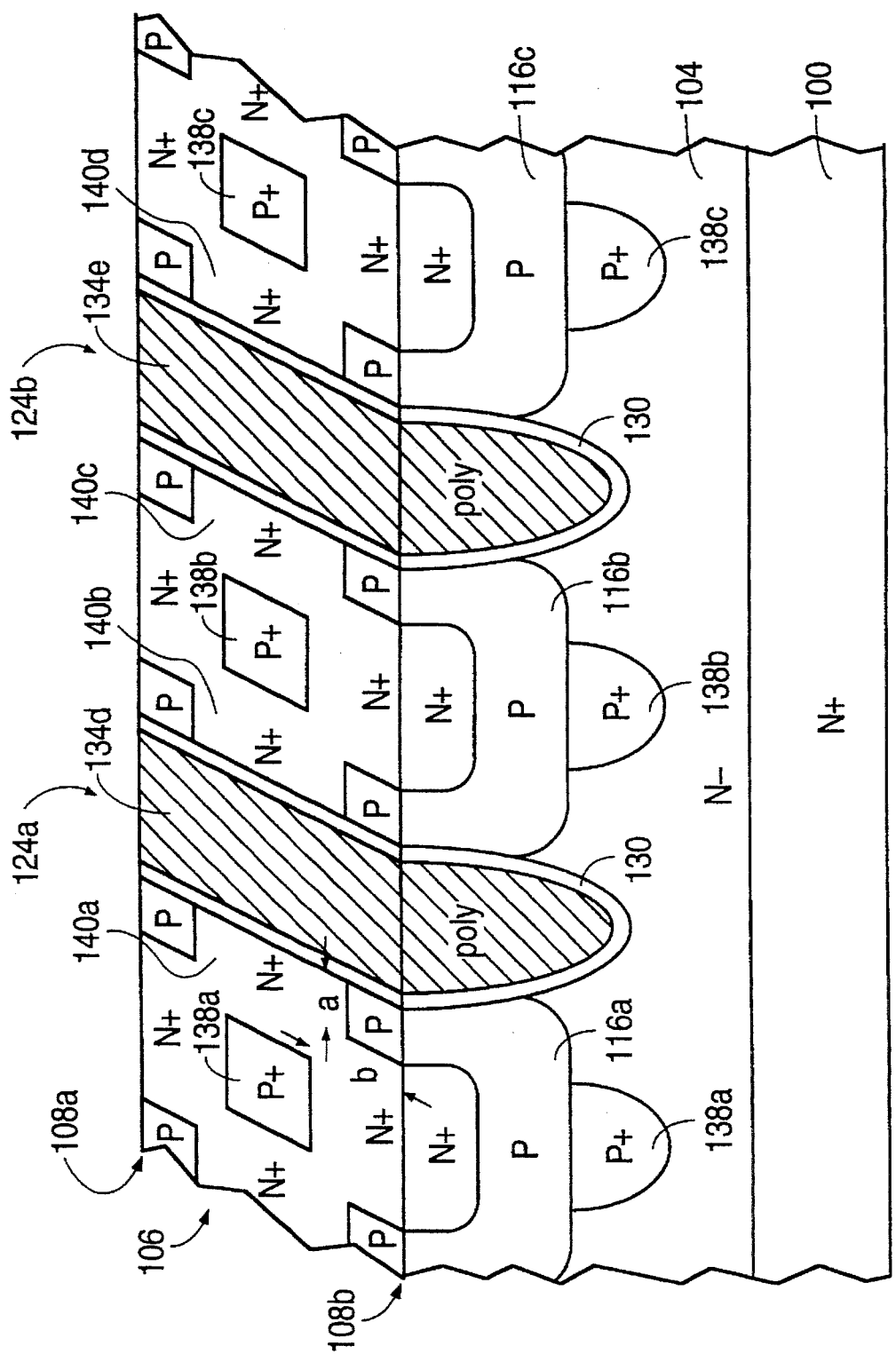
FIG. 1 depicts a perspective view of a portion of a transistor in accordance with the present invention.

FIG. 1 shows a prospective, (combined cross-sectional and plan) view of a multi-cell DMOS trenched transistor in accordance with the present invention. It is to be understood that this view is of a portion of such a transistor, illustrating a few cells thereof. Moreover, only the transistor substrate and the associated doped regions are shown together with the trenches. That is to say, the overlying insulating layers, gate structures, and conductive interconnect are not shown for simplicity; these are illustrated in later figures.

In FIG. 1, formed on the conventional N+ doped substrate 100 is an N– doped epitaxial layer 104. Formed in epitaxial layer 104 are two (exemplary) trenches 124a and 124b which are conventionally etched, as described below. Lining each of trenches 124a, 124b is oxide insulating layer 130.

Each trench 124a, 124b is filled with a doped polysilicon structure, respectively 134d, 134e. The principal surface of the epitaxial layer 104 is designated 106. Additional trenches intersect trenches 124a, 124b at right angles thereto, defining the intervening cells. The edges of these adjacent intersecting trenches 108a, 108b are labelled.

Illustrated in FIG. 1 are two cells of a transistor which are conventionally electrically interconnected by an overlying interconnect, as described below. The first cell includes trench 124a, a P doped body region 116a, an N+ doped source region 140a, and a P+ doped deep body region 138a. (The doping levels and depths of these regions are described in detail below.) The second cell includes P doped body region 116b, N+ doped source region 140b, 140c, and P+ doped deep body region 138b. The third cell includes P doped body region 116c, N+ doped source region 140d, and P+ doped deep body region 138c.

The structure shown in FIG. 1 is largely conventional except for the shape (both in the plan view and cross-sectional view) of the N+ regions 140a, 140b, 140c, and 140d. In each case these regions are formed so that in addition to the central P+ doped deep body regions, respectively 138a, 138b, and 138c, they also define at their corners in this case rectangular "cutouts" allowing the underlying body regions respectively 116a, 116b, and 116c to extend to the substrate principal surface 106 and thereby to contact the trenches at the corner of each cell. Thus as shown in the plan view portion of FIG. 1, each N+ region 140a, 140b 140c, 140d defines a cross-like structure due to the corner cutouts which are P regions. In contrast, in the prior art each N+ region extends (both in the plan view and in the cross-sectional view) to the side of the adjacent trench. Thus in the prior art in a plan view the N+ regions would be squares rather than crosses. Similarly, in a cross sectional view of the prior art the N+ regions would each extend all the way to the associated trench, rather than being spaced apart therefrom by intervening P regions 116a, 116b, and 116c.

In one embodiment, the dimensions "a" and "b" which are the spacing between the nearest portion of N+ region 140a, for example, and the trench 124a are each 1 micron. These dimensions are determined by the process tolerance limitations; it is desirable that the N+ source region approach as close as possible to the trench while not actually contacting the trench at the trench corners. Thus in other embodiments dimensions "a", "b" are less than 1 micron, or possibly more. It is desirable that dimensions "a", "b" are minimized so as to minimize the source/drain on-resistance of the transistor The larger are dimensions "a" and "b", the larger is the undesirable source/drain on-resistance ($R_{DSON}$).

The shape of the cutouts defined by dimensions "a" and "b" in FIG. 1 need not be a square (as in FIG. 1) but may be any shape, i.e., rectangular, oval, semicircle, etc. Thus dimensions "a" and "b" need not be equal. Also, dimensions "a" and "b" depend on the trench critical dimensions and the alignment technology; again "a" and "b" are desirably as small as possible.

P+ deep body regions 138a, 138b, 138c in another embodiment are shallower than the associated P body regions 116a, 116b, 116c. Alternatively, the P+ deep body regions may be dispensed with since their purpose is to impart device ruggedness.

It is to be understood that the drain electrode for the transistor is conventionally formed on the backside surface (not shown) of the underlying substrate 100 in FIG. 1.

Figure 2:
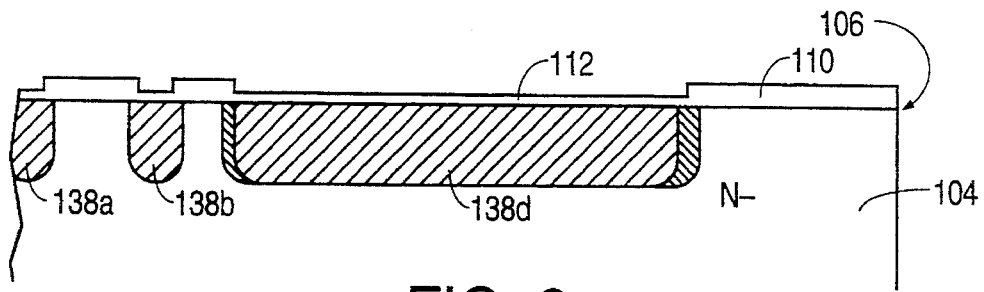

FIG. 2 shows in cross section a first process step to form a trenched DMOS field effect transistor as depicted in FIG. 1. It is to be understood that this process is exemplary and other processes may be used to fabricate the final transistor structure.

A substrate 100 of FIG. 1 (not shown in FIG. 2) which is conventionally N+ doped has an epitaxial layer 104 which is N− doped grown on the surface of the substrate. Epitaxial layer 104 is approximately 5 to 10 microns ($10^{-6}$m) thick.

Principal surface 106 of the epitaxial layer 104 is conventionally oxidized to form a silicon dioxide layer 110 approximately 1 micron thick. Silicon dioxide layer 110 is conventionally patterned using photoresist and a mask to define the P+ (deep body) regions 138a, 138b, 138d. (Note that FIGS. 2 to 7a and 8 to 13 do not correspond exactly to FIG. 1 since the termination structure is not shown in FIG. 1.) The P+ implant step is carried out by implanting boron at a energy level of 60 KEV with a dosage of $2\times10^{13}$ to $1\times10^{16}$/cm$^2$. Alternatively, boron is pre-deposited by using the boron nitride process. This forms the P+ doped regions 138a, 138b, 138d after the conventional diffusion step. (Region 138d is not a deep body region in function since it is a part of the transistor termination structure.) An oxide layer 112 of approximately 0.5 micron (5000 Å) thickness is also grown during this diffusion. The final depth of the P+ deep body regions is 1.5 to 3.5 microns.

It is to be understood that the P+ region 138d and all portions of the transistor structure to the right thereof are the termination portion (edge) of an integrated circuit die, the vertical line at the far right being a die scribe line. The termination structure disclosed herein is exemplary and not limiting.

Figure 3:
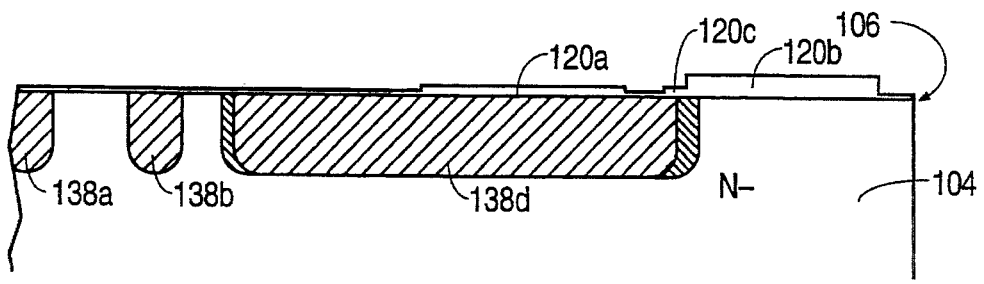

In FIG. 3, an active region mask layer is formed by covering the principal surface 106 with a photoresist layer which is then conventionally exposed and patterned using a mask to leave the active mask portions 120a, 120b, 120c as shown in FIG. 3.

Figure 4:
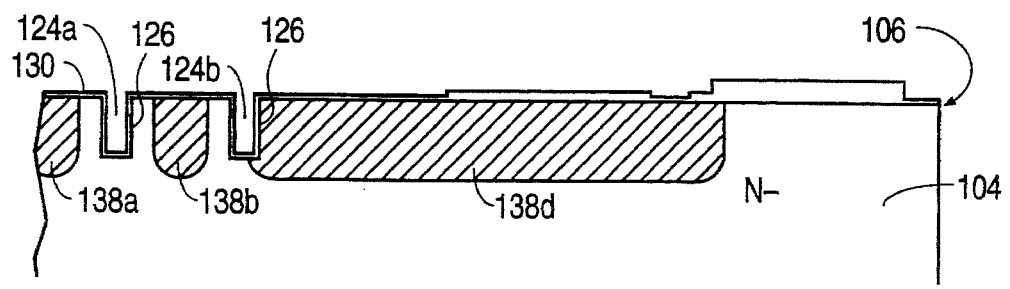

Then in FIG. 4, first a low temperature oxide undoped (LTO) layer (not shown) is deposited over the entire principal surface 106 after a cap oxide layer 300 Å thick (also not shown) is grown to prevent out diffusion from the LTO layer. This low temperature oxide when patterned is used as an etch mask for defining the locations of the trenches. The LTO layer is then conventionally patterned using photoresist to form openings therethrough to define the location of trenches 124a, 124b, which upon completion are each typically 0.5 to 1.5 microns wide and pitched 5 to 10 microns apart (center-line to center-line). Then trenches 124a, 124b, are dry etched through the mask openings by reactive ion etching (RIE) to a typical depth of 1.5 microns (a typical range is 0.5 to 10 microns). Then the LTO mask layer is stripped by a buffered oxide etch. Alternatively a conventional photoresist mask is directly applied to define the trench regions, without growing the cap oxide or depositing the LTO layer. The process depends on the desired trench depth and trench etch techniques.

Then the sidewalls 126 of each trench 124a, 124b are smoothed, first using a chemical dry etch to remove a thin layer of silicon (approximately 500 Å to 1000 Å thick) from the trench sidewalls 126. This thin removed layer eliminates damage caused by the earlier reactive ion etching, and this etching step also rounds off the top and bottom portions of the trenches.

Then a further sacrificial oxidation step smoothes the trench sidewalls 126. A layer of silicon dioxide (not shown) is conventionally thermally grown on the sidewalls 126 of the trench to a thickness of approximately 200 Å to 2,000 Å. This sacrificial oxide layer is removed by a either buffer oxide etch or an HF etch to leave the trench sidewalls 126 as smooth as possible.

The gate oxide layer 130 is then grown as shown in FIG. 4 lining the trench sidewalls 126 and extending over the principal surface 106, to a thickness of approximately 100 Å to 1000 Å.

Figure 5A:
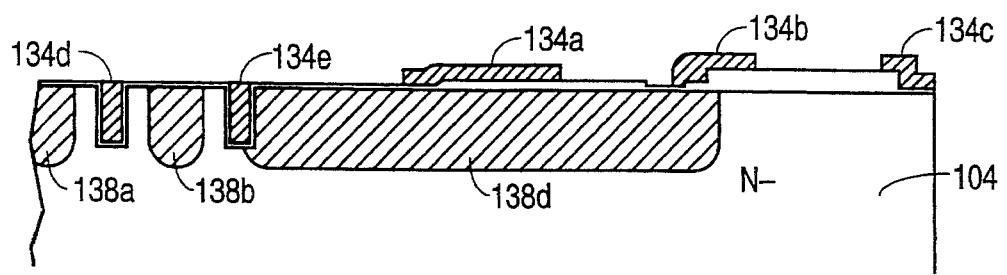

Then as shown in FIG. 5a a layer of polycrystalline silicon (polysilicon) is deposited to e.g. approximately 1.5 microns thickness (a typical range is 0.5 to 1.5 microns), filling trenches 124a, 124b. Next, planarization of the polysilicon layer is followed by a blanket etch to optimize the polysilicon thickness and to leave only a thickness of 0.5 micron (5,000 Å). Thus a 1 micron thickness (10,000 Å) of polysilicon is removed by this uniform etching.

Then the polycrystalline silicon layer (for an N-channel transistor) is doped with phosphorus chloride (POCl$_3$) or implanted with arsenic or phosphorous to a resistivity of approximately 15 to 30 ohms per square. The polycrystalline silicon layer then is patterned to form the structures 134a, 134b, 134c and also gate electrodes 134d, 134e. This patterning uses a photoresist layer which is exposed and mask patterned. The polycrystalline silicon structures 134a, 134b, 134c in the right-hand portion of FIG. 4 are a part of the gate contact and termination portions of the transistor.

Figure 5B:
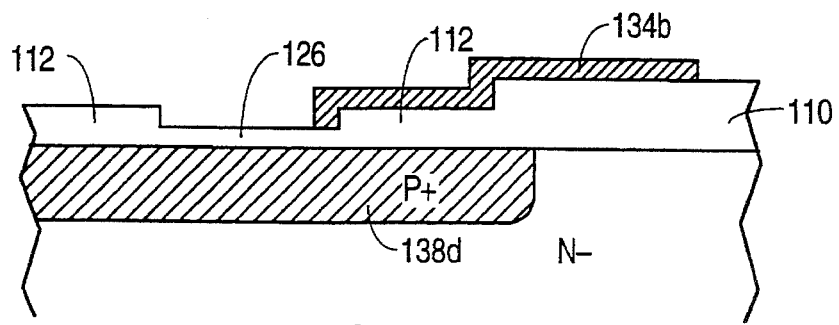

FIG. 5b is an enlarged view of the portion of FIG. 5a at the area of polysilicon structure 134b. Illustrated is the step-like configuration of polysilicon structure 134b due to the three underlying thicknesses of oxide, respectively oxide layers 126, 112, and 110. This step-like configuration, although only shown in FIG. 10b, is present also in the structures of FIGS. 6 to 13.

Figure 6:
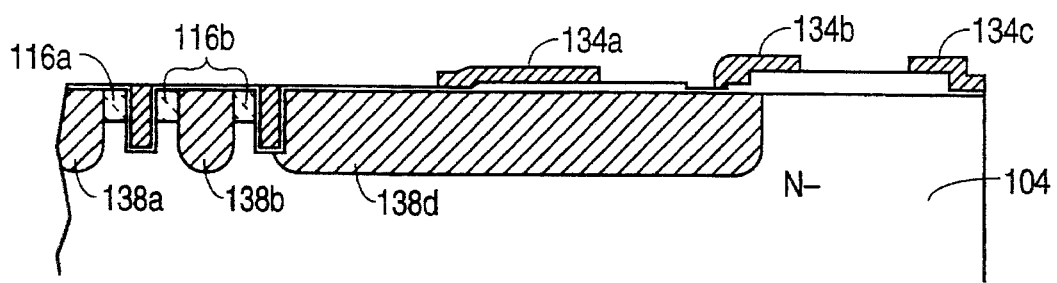

Next in FIG. 6 the P body regions 116a, 116b are implanted and diffused. There is no body region implant mask, i.e. the P body implant 116a, 116b is uniform across the wafer. Instead of a body mask, the previously formed active mask layer 120a, 120b prevents the P body implant from doping the termination region.

The P body regions 116a, 116b are boron implanted at 40 to 60 KEV with a dose of $2\times10^{13}$ to $2\times10^{14}$/cm$^2$. After diffusion, the depth of the P body regions 116a, 116b is approximately 0.5 to 2.0 micron.

Figure 7A:
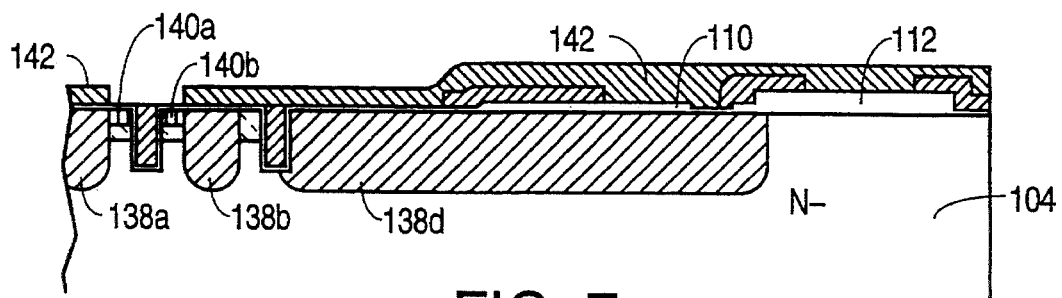

Next in FIG. 7a the N+ doped source regions 140a, 140b, 140c, 140d, 140e are implanted and diffused, with use of a dedicated photoresist masking process, involving patterned masking layer 142. The source regions 140a, 140b, 140c, 140d, 140e are an N+ arsenic implant at 80 KEV with a dosage of typically $5\times10^{15}$ to $1\times10^{16}$/cm$^2$. After implantation, the N+ regions are diffused to a depth of approximately 0.2 to 0.5 microns and then mask layer 142 is stripped.

It is to be understood that the cross-sectional views in FIGS. 2 through 7a and 8 through 11 are taken through the center of P+ regions 138a, 138b of FIG. 1 and thus do not depict the cutout configuration of the N+ source regions.

Figure 7B:
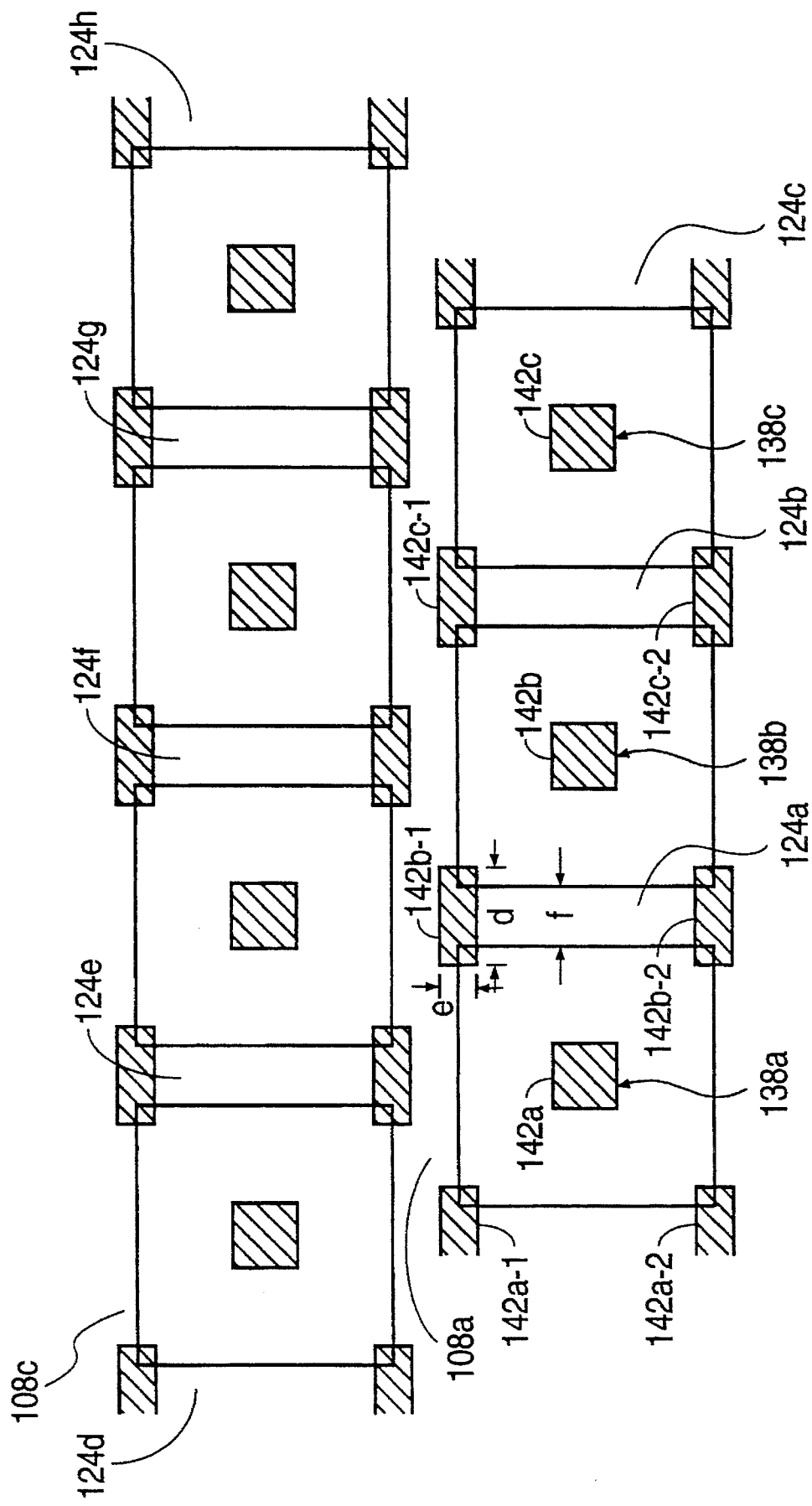

FIG. 7b is a plan view of the step depicted in FIG. 7a but showing additional portions of the structure. In FIG. 7b a number of cells of the transistor are depicted. However, the termination structure which is depicted in the right-hand portion of FIG. 7a is not shown in FIG. 7b; instead only active cells are depicted, i.e., the left-hand portion of FIG. 7a. Shown in FIG. 7b are the trenches 124a, 124b, and an additional trench 124c, as well as the trenches defining the next row of cells which are trenches 124e, 124f, 124g and 124h. Also depicted are the intersecting trenches 108a, 108b, as depicted in FIG. 1 and an additional intersecting trench 108c. These trenches thereby define the depicted square cells.

Of most importance, depicted in FIG. 7b is the blocking mask layer 142 in FIG. 7a which defines the lateral extent of the N+ source regions. This blocking mask layer is shown by the cross-hatched numerous small rectangular areas in FIG. 7b. The small rectangular areas, i.e. 142a, 142b, 142c in the center of each of the cells, define the underlying P+ deep body topside contact regions 138a, 138b, 138c. The corresponding structure in the upper row of cells in FIG. 7b is not labeled but is similar.

This portion of the structure is essentially conventional. However, the significant portions of blocking mask 142 are the additional rectangular masking layer portions designated (for the first row of cells in FIG. 7b) respectively 142a-1, 142a-2, 142b-1, 142b-2, and 142c-1, 143c-2. These define the N+ region cutouts depicted in the top view in FIG. 1, as can be understood by comparing FIG. 7b to FIG. 1. The dimensions of each small rectangular mask portion, for example, portion 142a-1, are "d" by "e" where e.g. "d" is 3.5 microns and "e" is 1.7 microns. These dimensions were selected to achieve the desired amount of overlap which is typically a 1 micron overlap (dimension "a") as shown in FIG. 1. This overlap assumes that the trench width is 1.5 microns, which is dimension "f" in FIG. 7b.

The trenches for the first row of cells are in one embodiment conventionally offset from those in the second row of cells in FIG. 7b, although this is not essential to the invention.

Figure 8:
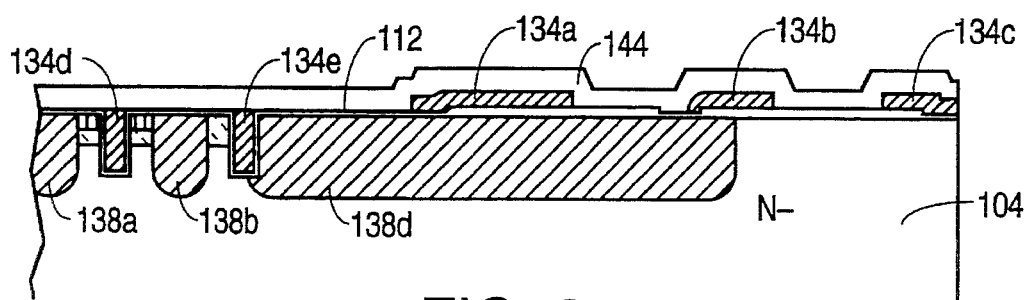
Figure 9:
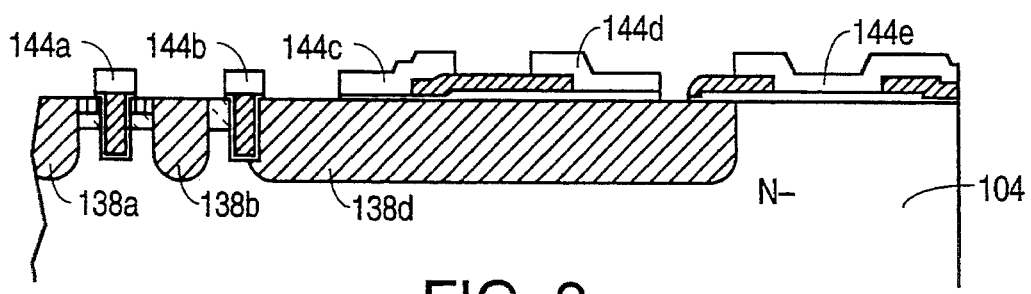

Next, as shown in FIG. 8 after mask layer 142 is conventionally stripped, a BPSG (boro-phosphosilicate glass) layer 144 is conventionally formed to a thickness of approximately 0.5 to 1.5 microns over the entire principal surface 106 and over the polysilicon structures 134a, 134b, 134c, 134d, 134e. BPSG layer 144 is covered with a photoresist layer (not shown) which is patterned after exposure and then the underlying BPSG layer 144 and oxide layer 112 are etched so as to leave the BPSG regions 144a, 144b, . . . , 144e, between which are defined the transistor contact areas. Then, a reflow step smooths the corners on the BPSG layer structures 144a, . . . , 144e.

Figure 10A:
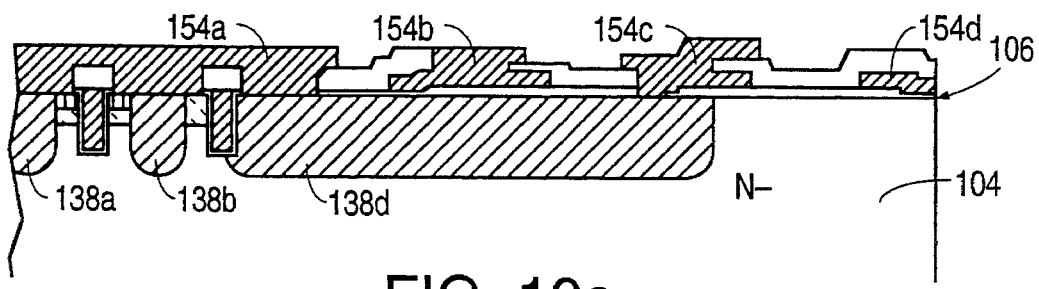
Figure 10B:
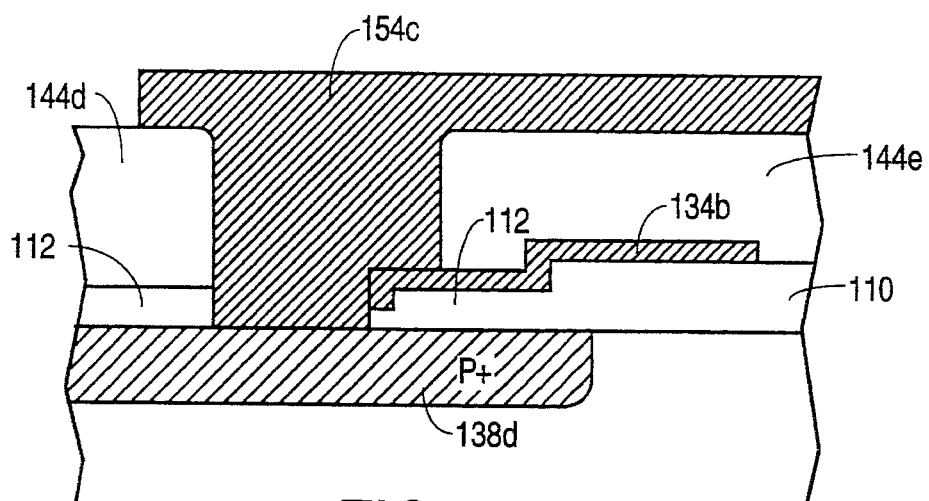

Then as shown in FIG. 10a, conventional interconnect metal masking steps are performed, involving covering the entire principal surface 106 with aluminum conventionally alloyed with small amounts of silicon. This aluminum layer is then conventionally patterned using a mask to define the metallization areas 154a, 154b, 154c, 154d. These metallization areas are respectively the active (source-body) contact 154a, gate finger contact 154b, field plate 154c, and equipotential ring (EQPR) 154d. After scribing, EQPR 134d is shorted to the substrate 104.

FIG. 10b is an enlarged view of a portion of FIG. 10a (similar to FIG. 5b) and showing the stepped oxide structure 110, 112 underlying polysilicon field plate 134b and field plate contact 154c.

Figure 11:
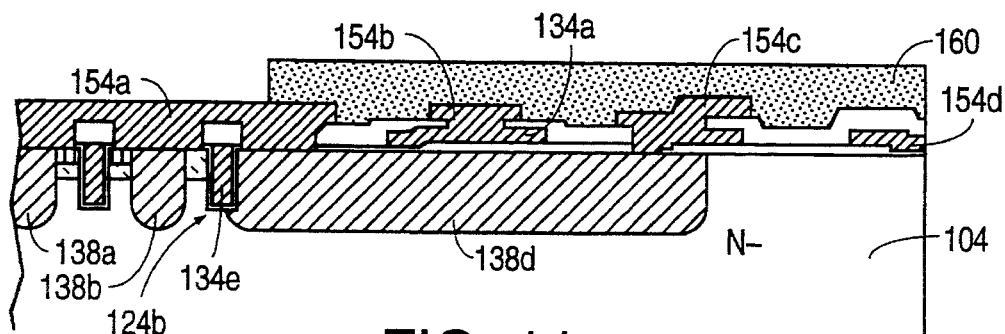

The next step is pad masking in FIG. 11. This involves surface passivation using for instance nitride or PSG (phosphosilicate glass) layer 160 deposited over the entire structure and then conventionally masked with portions thereof thereinafter removed as in FIG. 11 to open pad areas for connection of bonding wires to the earlier formed active metallization contact 154a and to the other metallization areas as needed. (The steps described above in conjunction with FIGS. 8 to 11 are conventional.)

Figure 12:
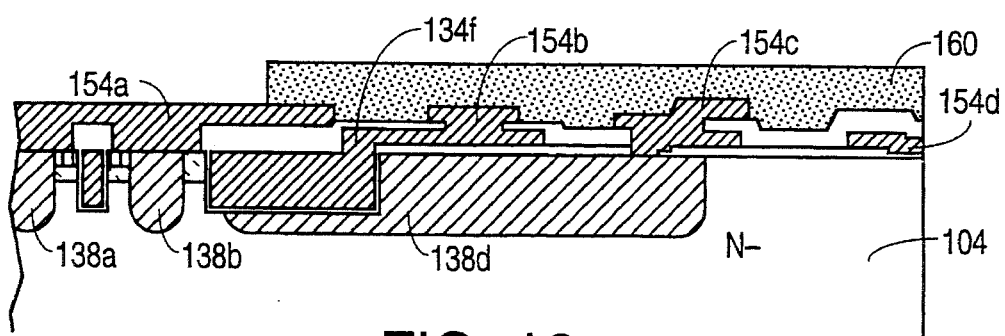

FIG. 12 is a cross-section depicting many of the same structures as shown in FIG. 11 but at a different portion of a cell, thus better illustrating the polysilicon gate runner connection 134f in the central portion of the figure. Gate runner connection 134f is typically located at the die perimeter. The gate runner 134f conventionally electrically connects all of the gates. At the location of gate runner 134f, the cross section of FIG. 12 is along an "L shape" (dog leg) in plan view (not shown) to better illustrate the gate runner 134f along a length of its trench.

Figure 13:
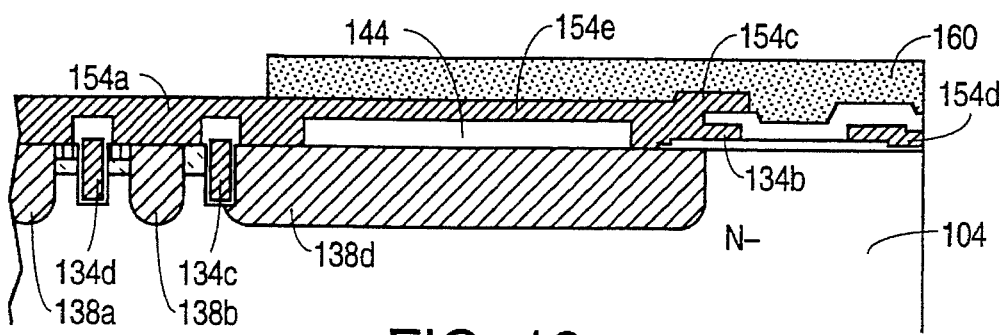

FIG. 13 illustrates an additional cross-section showing other portions of the termination. In this case the field plate 154c which is a termination conductive structure conventionally provided for power transistors, connects to the source-body region metal contact 154a by a metal crossover 154e which crosses over the BPSG insulating layer 144 in the termination region to the field plate contact 154c and the field plate 134b.

Also in accordance with the invention, each cell next to a gate finger is a dummy (nonactive due to having no channel) cell. Thus the entire cell row e.g. 134e in FIG. 11 adjacent to a gate finger 134a consists of dummy cells. This structure is achieved by the same mask as the blocking implant mask in FIG. 7a so that no N+ source implant is made adjacent polysilicon trench filling 134e. Thus the dummy cells are implemented by providing the doped regions immediately to the right of trench 124b as having no active regions and hence serving as portions of a dummy cell. The dummy cells have been found to improve reliability and also device ruggedness. These dummy cells are dispensed with in other embodiments.

The above description of the invention is illustrative and not limiting; for instance the same steps may be used with the conductivity types of the various semiconductor regions reversed also to form a transistor in accordance with the invention. Other modifications will be apparent to one of ordinary skill in the art in the light of this disclosure and are intended to fall within the appended claims.

We claim:

1. A trenched transistor cell comprising:

a substrate of a first conductivity type and defining at least two intersecting trenches;

an insulating layer lining the trenches;

a conductive material filling the trenches;

a source region of the first conductivity type and extending from a principal surface of the substrate adjacent to the trenches into the substrate; and a body region of a second conductivity type opposite the first type and extending from the principal surface adjacent to the trenches into the substrate;

wherein at a corner of the cell defined by the two intersecting trenches, the source region is spaced apart from the trenches.

2. The cell of claim 1, wherein the source region is spaced apart from the corner of the cell by at least 0.1 microns and at the corner of the cell the body region is in contact with the trenches.

3. The cell of claim 1, wherein the cell includes at least four corners each defined by two intersecting trenches, and the source region is spaced apart from each corner of the cell.

4. The cell of claim 1, wherein a width of the trench is less than about 1.5 microns.

5. The cell of claim 1, wherein the body region extends into the substrate less than about 1.5 microns.

6. The cell of claim 1, wherein the source region extends into the substrate less than about 0.5 microns.

7. The cell of claim 2, wherein at the corner of the cell, the source region is not in contact with the trenches.

8. The cell of claim 1, further comprising an additional body region of the second conductivity type and extending from the principal surface at a central portion of the source region into the substrate, to a depth different than that of the body region.

9. The cell of claim 2, wherein at the principal surface the body region defines a rectangular area in contact with the trenches.

10. The cell of claim 1, further comprising a plurality of similar cells arranged in rows, and including a gate finger connecting the conductive material filling the trench in each row, and wherein a row of the cells adjacent the gate finger is inactive.

11. The cell of claim 1, wherein at a side of the cell away from the corner of the cell and defined by one of the trenches, the source region is adjacent that one of the trenches.

12. A trenched transistor cell comprising:

a substrate of a first conductivity type and defining at least two intersecting trenches;

an insulating layer lining the trenches;

a conductive material filling the trenches;

a source region of the first conductivity type and extending from a principal surface of the substrate adjacent to the trenches into the substrate; and a body region of a second conductivity type opposite the first type and extending from the principal surface adjacent to the trenches into the substrate;

wherein at a corner of the cell defined by the two intersecting trenches, the source region is spaced apart from both of the trenches, and at a side of the cell away from the corner of the cell, the source region is adjacent one of the trenches.

13. A method of forming a transistor cell comprising:

providing a semiconductor substrate having a first region of a first conductivity type extending from a principal surface of the substrate;

forming at least two trenches in the substrate and extending into the substrate from the principal surface, the trenches intersecting to define a corner of the cell;

forming an insulating layer lining the trenches;

forming a conductive electrode in the trenches overlying the insulating layer;

forming a body region in the substrate having a second conductivity type, the body region extending into the substrate alongside the at least two trenches;

forming a masking layer over the principal surface and covering the principal surface at the corner; and forming a source region of the first conductivity type and extending into the substrate from the principal surface alongside the at least two trenches, an extent of the source region being defined by the masking layer, the source region thereby being spaced apart from the corner.

14. The method of claim 13, wherein the step of forming semiconductor regions comprises implanting ions in the substrate.

15. The method of claim 13, wherein the step of forming semiconductor regions comprises pre-depositing dopant in the substrate.

16. The method of claim 13, wherein the step of forming the insulating layer comprises the steps of:

growing a layer of oxide on the sidewalls of the trenches; and stripping off the layer of oxide, thereby smoothing the sidewalls and rounding off the bottom portion of the trenches.

17. The method of claim 16, further comprising, before the step of growing the layer of oxide, isotropically dry etching the sidewalls of the trenches, thereby smoothing the sidewalls and rounding off the top and bottom portion of the trenches.

18. The method of claim 13, further comprising forming an additional body region of the second conductivity type in the substrate and extending from the principal surface at a central portion of the source region into the substrate to a depth different than that of the body region.

19. The method of claim 13, wherein the step of forming a masking layer comprises defining a rectangular shaped mask portion at each corner of the cell.

20. The method of claim 13, further comprising the step of determining an area of a portion of the masking layer covering the principal surface at the corner as being dependent on a width of the trenches and process alignment techniques.

21. The method of claim 13, wherein the step of forming the source region includes forming the extent of the source region to be adjacent to one of the trenches at a side of the cell away from the corner of the cell.

\* \* \* \* \*